US012408385B2

(12) United States Patent
Seo et al.

(10) Patent No.: US 12,408,385 B2
(45) Date of Patent: Sep. 2, 2025

(54) THIN-FILM TRANSISTOR SUBSTRATE, MANUFACTURING METHOD THEREOF, AND DISPLAY APPARATUS EMPLOYING THE THIN-FILM TRANSISTOR SUBSTRATE

(71) Applicant: SAMSUNG DISPLAY CO., LTD., Yongin-si (KR)

(72) Inventors: Jongoh Seo, Yongin-si (KR); Janghyun Kim, Yongin-si (KR); Jongjun Baek, Yongin-si (KR); Dongmin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 278 days.

(21) Appl. No.: 17/845,301

(22) Filed: Jun. 21, 2022

(65) Prior Publication Data

US 2023/0395728 A1 Dec. 7, 2023

(30) Foreign Application Priority Data

Oct. 14, 2021 (KR) ........................ 10-2021-0136893

(51) Int. Cl.
*H10D 30/67* (2025.01)
*H10D 30/01* (2025.01)
(Continued)

(52) U.S. Cl.
CPC ..... *H10D 30/6757* (2025.01); *H10D 30/0321* (2025.01); *H10K 59/1213* (2023.02); *H10K 59/1216* (2023.02); *H10K 59/873* (2023.02)

(58) Field of Classification Search
CPC ............ H10D 30/0321; H10D 30/675; H10K 59/1213; H10K 59/873; H10K 59/1216
See application file for complete search history.

(56) References Cited

U.S. PATENT DOCUMENTS 6,392,277 B1  5/2002  Mitani et al.
8,063,453 B2  11/2011  Oh et al.
(Continued)

FOREIGN PATENT DOCUMENTS

CN  105870203 A  8/2016
JP  1998261801 A  9/1998
(Continued)

OTHER PUBLICATIONS

The Extended European Search Report for EP Patent Application No. 22199462.7 dated Apr. 13, 2023; 9 pages.
(Continued)

*Primary Examiner* — Vongsavanh Sengdara
(74) *Attorney, Agent, or Firm* — CANTOR COLBURN LLP

(57) ABSTRACT

Provided are a thin-film transistor substrate, a manufacturing method thereof, and a display apparatus. The thin-film transistor substrate includes: a substrate; a buffer layer on the substrate; a semiconductor layer arranged on the buffer layer and including a first conductive area, a second conductive area, and a channel area between the first conductive area and the second conductive area; a first dopant doped in an upper portion of the channel area at a first concentration; a second dopant doped in a lower portion of the channel area at a second concentration and being of a different type from a type of the first dopant; a gate insulating layer covering the semiconductor layer; and a gate electrode overlapping the channel area in a plan view and disposed on the gate insulating layer.

18 Claims, 11 Drawing Sheets

(51) Int. Cl.
*H10K 59/121* (2023.01)
*H10K 59/80* (2023.01)

(56) References Cited

U.S. PATENT DOCUMENTS

| | | | |
|---|---|---|---|
| 9,412,864 B2 | 8/2016 | Liu | |
| 2001/0019862 A1 | 9/2001 | Son et al. | |
| 2002/0190322 A1* | 12/2002 | Mouli | H01L 21/26513 |
| | | | 257/69 |
| 2004/0142579 A1* | 7/2004 | Morita | H10D 30/801 |
| | | | 438/154 |
| 2005/0116291 A1* | 6/2005 | Koo | H10K 59/124 |
| | | | 438/149 |
| 2009/0212363 A1* | 8/2009 | Krivokapic | H01L 21/2652 |
| | | | 438/157 |
| 2013/0009209 A1* | 1/2013 | Yamazaki | H10D 30/6758 |
| | | | 257/E21.409 |
| 2013/0078777 A1* | 3/2013 | Cheng | H10D 84/856 |
| | | | 257/E21.409 |
| 2015/0311468 A1 | 10/2015 | An et al. | |
| 2019/0280068 A1* | 9/2019 | Shin | H10D 30/6739 |
| 2019/0326378 A1* | 10/2019 | Kim | H10K 77/111 |
| 2020/0098934 A1* | 3/2020 | Shivaraman | H10D 30/031 |
| 2020/0295052 A1* | 9/2020 | Hideo | H10D 86/423 |
| 2021/0091233 A1* | 3/2021 | Yang | H10D 30/6715 |
| 2022/0115542 A1* | 4/2022 | Yang | H10D 86/423 |

FOREIGN PATENT DOCUMENTS

| | | |
|---|---|---|
| KR | 1019990009998 A | 2/1999 |
| KR | 100312988 B1 | 1/2002 |
| KR | 1020070079115 A | 8/2007 |
| KR | 101060616 B1 | 8/2011 |
| KR | 1020150125151 A | 11/2015 |
| KR | 1020190122923 A | 10/2019 |

OTHER PUBLICATIONS

Chuan-Hsing Chen, Investigation of Buried Channel PMOS, 1997, 15th Annual Microelectronic Engineering Conference.

* cited by examiner

THIN-FILM TRANSISTOR SUBSTRATE, MANUFACTURING METHOD THEREOF, AND DISPLAY APPARATUS EMPLOYING THE THIN-FILM TRANSISTOR SUBSTRATE

This application claims priority to Korean Patent Application No. 10-2021-0136893, filed on Oct. 14, 2021, and all the benefits accruing therefrom under 35 U.S.C. § 119, the content of which in its entirety is herein incorporated by reference.

BACKGROUND

1. Field

One or more embodiments relate to a thin-film transistor substrate, a manufacturing method thereof, and a display apparatus including the thin-film transistor substrate.

2. Description of the Related Art

A display apparatus is an apparatus which visually displays data. The display apparatus may be used as a display of a small-sized product such as a mobile phone, or may be used as a display of a large-sized product such as a television.

The display apparatus includes a plurality of pixels receiving electrical signals to emit light to display an image to the outside. Each of the plurality of pixels includes a display element, for example, an organic light-emitting diode ("OLED") in a case of an organic light-emitting display apparatus.

In general, the display apparatus includes thin-film transistors and capacitors to control emission of the pixels. The thin-film transistor includes, for example, a semiconductor layer including polysilicon, and a gate electrode at least partially overlapping the semiconductor layer. The semiconductor layer includes a channel area and dopant-doped source/drain areas on opposite sides of a semiconductor area, respectively. As the display apparatus having high quality may be implemented according to characteristics of the thin-film transistor, many studies are conducted to improve the quality of the thin-film transistor.

SUMMARY

One or more embodiments include a thin-film transistor having high quality, and a display apparatus employing the same.

Additional aspects will be set forth in part in the description which follows and, in part, will be apparent from the description, or may be learned by practice of the presented embodiments of the disclosure.

According to one or more embodiments, a thin-film transistor substrate includes: a substrate; a buffer layer on the substrate; a semiconductor layer arranged on the buffer layer and including a first conductive area, a second conductive area, and a channel area between the first conductive area and the second conductive area; a first dopant doped in an upper portion of the channel area at a first concentration; a second dopant doped in a lower portion of the channel area at a second concentration and being of a different type from a type of the first dopant; a gate insulating layer covering the semiconductor layer; and a gate electrode overlapping the channel area in a plan view and disposed on the gate insulating layer.

According to an embodiment, the first dopant may be doped in the first conductive area and the second conductive area at a third concentration, and the third concentration may be greater than the first concentration.

According to an embodiment, the third concentration may be about 100 times to about 1,000 times greater than the first concentration.

According to an embodiment, the second dopant may be at least partially doped in an upper portion of the buffer layer.

According to an embodiment, each of the first concentration of the first dopant and the second concentration of the second dopant in the channel area may be in a range from about $1 \times 10^{11}$ ions/cm$^2$ to about $1 \times 10^{13}$ ions/cm$^2$.

According to an embodiment, the substrate may include a first base layer, a first inorganic barrier layer, a second base layer, and a second inorganic barrier layer, which are sequentially stacked, and the first dopant may be doped in the second inorganic barrier layer.

According to an embodiment, a concentration of the first dopant doped in the second inorganic barrier layer may be in a range from about $1 \times 10^{11}$ ions/cm$^2$ to about $1 \times 10^{13}$ ions/cm$^2$.

According to an embodiment, the thin-film transistor substrate may further include a barrier layer between the substrate and the buffer layer, where the first dopant may be doped in the barrier layer.

According to an embodiment, the first dopant may be boron (B), and the second dopant may be phosphorus (P).

According to an embodiment, a maximum concentration position of the first dopant in the channel area may be at a depth of about 50 angstroms (Å) to about 70 Å from the upper surface of the channel area, and a maximum concentration position of the second dopant in the channel area may be at a depth of about 200 Å to about 300 Å from the upper surface of the channel area.

According to one or more embodiments, a method of manufacturing a thin-film transistor substrate includes: injecting a first dopant into a substrate with a first acceleration voltage; forming a buffer layer and a semiconductor layer on the substrate; injecting a second dopant into a boundary area between the buffer layer and the semiconductor layer with a second acceleration voltage; injecting the first dopant into a channel area of the semiconductor layer with a third acceleration voltage; and injecting the first dopant in a source area and a drain area of the semiconductor layer.

According to an embodiment, the forming of the semiconductor layer may include crystallizing amorphous silicon on the substrate into crystalline silicon before the injecting of the second dopant.

According to an embodiment, the second acceleration voltage may be greater than the third acceleration voltage.

According to an embodiment, the second acceleration voltage may have a value from about 10 kilo-electronvolts (keV) to about 40 keV, and the third acceleration voltage may have a value from about 1 keV to about 5 keV.

According to an embodiment, a concentration of the first dopant injected into the source area and the drain area of the semiconductor layer may be about 100 times to about 1,000 times greater than a concentration of the first dopant injected into the channel area of the semiconductor layer.

According to one or more embodiments, a display apparatus includes: a substrate; a buffer layer on the substrate; a pixel circuit arranged on the buffer layer and including a thin-film transistor; and a display element electrically connected to the pixel circuit. Here, the thin-film transistor includes: a semiconductor layer including a first conductive area, a second conductive area, and a channel area between the first conductive area and the second conductive area; a first dopant doped in an upper portion of the channel area at a first concentration; a second dopant doped in a lower portion of the channel area at a second concentration and being of a different type from a type of the first dopant; and a gate electrode overlapping the channel area in a plan view.

According to an embodiment, the first dopant may be doped in the first conductive area and the second conductive area at a third concentration, and the third concentration may be greater than the first concentration.

According to an embodiment, the second dopant may be at least partially doped in an upper portion of the buffer layer.

According to an embodiment, the substrate may include a first base layer, a first inorganic barrier layer, a second base layer, and a second inorganic barrier layer, which are sequentially stacked, and the first dopant may be doped in the second inorganic barrier layer.

According to an embodiment, the display apparatus may further include a barrier layer between the substrate and the buffer layer, where the first dopant may be doped in the barrier layer.

According to an embodiment, the pixel circuit may further include a capacitor overlapping the thin-film transistor in the plan view.

According to an embodiment, the capacitor may include a lower electrode and an upper electrode, and the lower electrode may be integrally provided with the gate electrode.

According to an embodiment, the display element may include an organic light-emitting diode including a pixel electrode, an intermediate layer, and an opposite electrode.

According to an embodiment, the display apparatus may further include a thin-film encapsulation layer covering the display element, where the thin-film encapsulation layer may include a first inorganic encapsulation layer, an organic encapsulation layer, and a second inorganic encapsulation layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
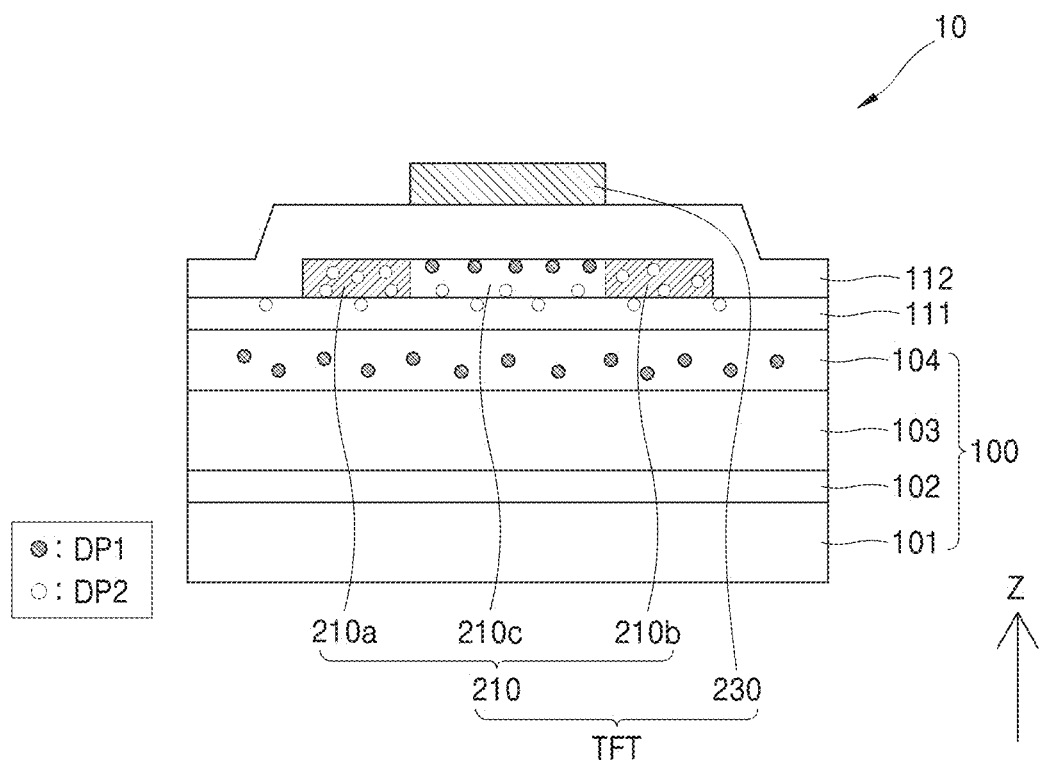
FIG. 1A is a cross-sectional view schematically illustrating a thin-film transistor substrate according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. Effects and features of the present disclosure and methods of achieving the same will be apparent with reference to embodiments and drawings described below in detail. The present disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will be omitted. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In the following embodiments, an expression used in the singular encompasses the expression of the plural, unless it has a clearly different meaning in the context.

In the following embodiments, it is to be understood that the terms such as "including," "having," and "comprising" are intended to indicate the existence of the features, or elements disclosed in the present disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or".

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

The x-axis (x direction), the y-axis (y direction) and the z-axis (z direction) are not limited to three axes of the rectangular coordinate system, and may be interpreted in a broader sense. For example, the x-axis, the y-axis, and the z-axis may be perpendicular to one another, or may represent different directions that are not perpendicular to one another. As used herein, "plan view" is a view from z direction.

Figure 1B:
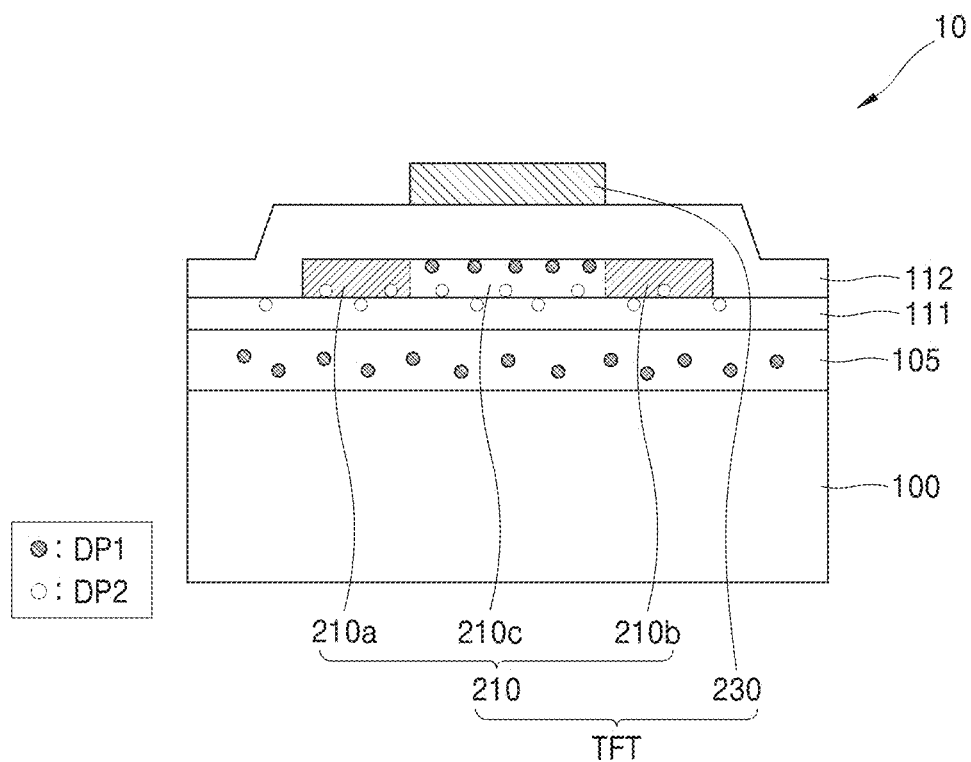
FIG. 1B is a cross-sectional view schematically illustrating a thin-film transistor substrate according to an embodiment.
Figure 2A:
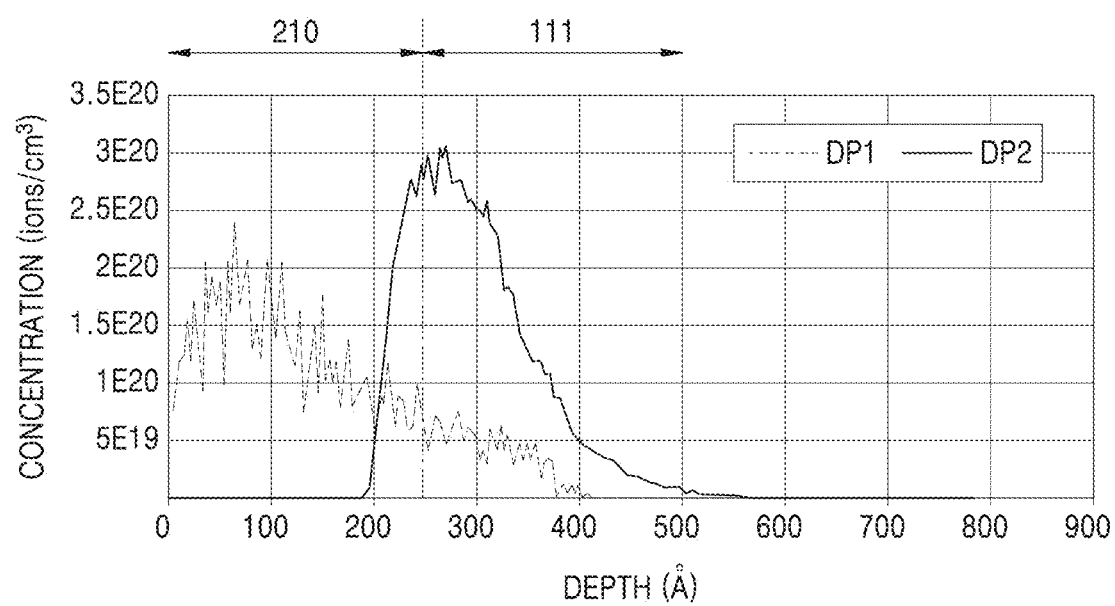
FIGS. 2A and 2B are graphs each illustrating positions where dopants are injected into a thin-film transistor substrate according to an embodiment.
Figure 2B:
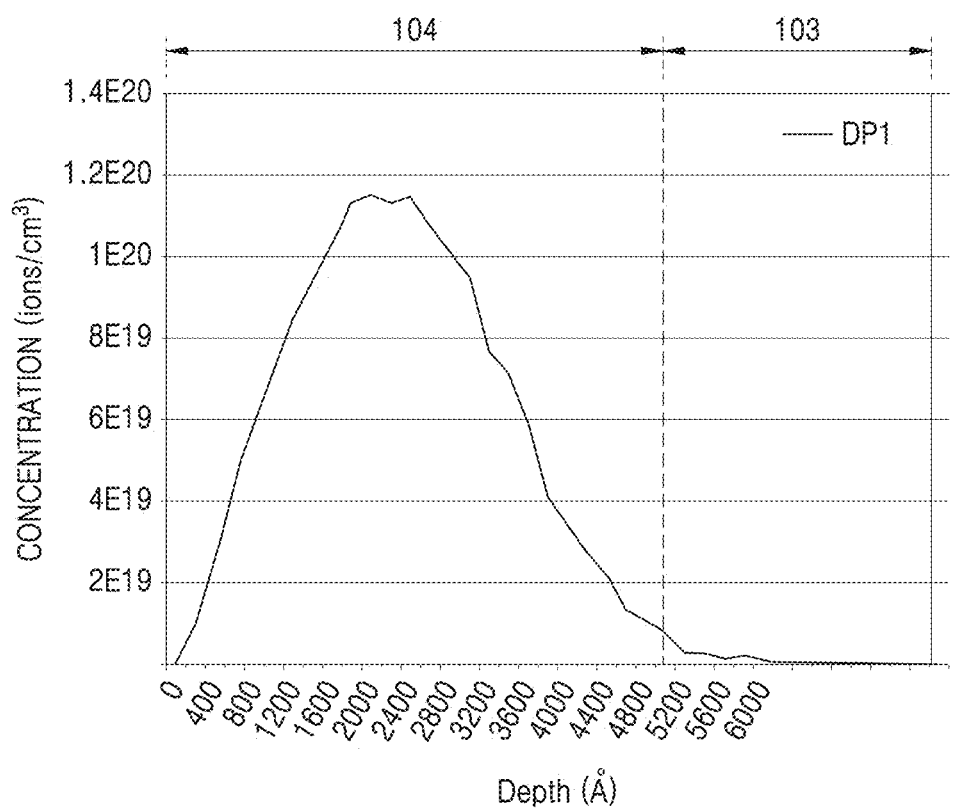

FIGS. 1A and 1B are cross sectional views each schematically illustrating a thin-film transistor substrate 10 according to an embodiment. FIGS. 2A and 2B are graphs each illustrating positions where dopants are injected into a thin-film transistor substrate according to embodiments.

Referring to FIG. 1A, the thin-film transistor substrate 10 may include a substrate 100, a buffer layer 111, and a thin-film transistor TFT. In the present disclosure, the thin-film transistor substrate 10 may mean any device including the thin-film transistor TFT. For example, the thin-film transistor substrate 10 may be a thin-film transistor array substrate in which a plurality of thin-film transistors TFT are arranged, or a display apparatus such as an organic light-emitting display apparatus, an inorganic light-emitting display apparatus, a liquid crystal display apparatus, or the like.

The thin-film transistor TFT according to the present embodiment includes a semiconductor layer 210 and a gate electrode 230 overlapping the semiconductor layer 210 in a plan view, where the semiconductor layer 210 includes a first dopant DP1 and a second dopant DP2, which are different types from each other.

The substrate 100 may include a glass material, a ceramic material, a metal material, or a material having a flexible or bendable characteristic. In an embodiment, the substrate 100 is a flexible substrate, and may include a first base layer 101, a first inorganic barrier layer 102, a second base layer 103, and a second inorganic barrier layer 104, which are sequentially stacked. The first base layer 101 and the second base layer 103 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

Each of the first inorganic barrier layer 102 and the second inorganic barrier layer 104 may be a barrier layer that prevents penetration of foreign substances from the outside. Each of the first inorganic barrier layer 102 and the second inorganic barrier layer 104 may include an inorganic material such as silicon oxide ($SiO_2$), silicon nitride ($SiN_x$), silicon oxynitride (SiON), and amorphous silicon (a-Si), and may have a single-layered structure or a multi-layered structure. In some embodiments, the first inorganic barrier layer 102 may be provided by stacking silicon oxide ($SiO_2$) and an amorphous silicon layer.

The buffer layer 111 may be on the substrate 100. The buffer layer 111 may prevent diffusion of impurity ions and penetration of moisture or external air, and may provide a flat surface. The buffer layer 111 may include an inorganic material such as an oxide or a nitride, an organic material, or a composite of an organic material and an inorganic material, and may include a single-layered or multi-layered structure including the inorganic material and the organic material. In some embodiments, the buffer layer 111 may include silicon oxide ($SiO_2$), silicon nitride ($SiN_x$), or silicon oxynitride ($SiO_xN_y$).

The thin-film transistor TFT may be on the buffer layer 111. The thin-film transistor TFT may include the semiconductor layer 210 on which a channel is formed, the gate electrode 230 for applying an electric field to form the channel, and a gate insulating layer 112 between the semiconductor layer 210 and the gate electrode 230.

The semiconductor layer 210 may include amorphous silicon or polysilicon. The semiconductor layer 210 may include a first conductive area 210a, a second conductive area 210b, and a channel area 210c.

In the present disclosure, the semiconductor layer 210 includes the first dopant DP1 and the second dopant DP2, which are different types from each other. The first dopant DP1 and the second dopant DP2 may have different types of charges.

When the thin-film transistor TFT is a P-type transistor, the first dopant DP1 may be a P-type dopant such as a Group 13 element including boron (B), aluminum (Al), gallium (Ga), indium (In), or the like, and the second dopant DP2 may be an N-type dopant such as a Group 15 element including nitrogen (N), phosphorus (P), arsenic (As), or the like. When the thin-film transistor TFT is an N-type transistor, the first dopant DP1 may be an N-type dopant, and the second dopant DP2 may be a P-type dopant.

In the channel area 210c, the first dopant DP1 may be doped in an upper portion of the channel area 210c far from the substrate 100 at a first concentration, and the second dopant DP2 may be doped in a lower portion of the channel area 210c close to the substrate 100 at a second concentration. Each of the first concentration and the second concentration may be in a range from about 1E11 ions/cm$^2$ to about 1E13 ions/cm$^2$ ($1\times10^{11}$ to $1\times10^{13}$).

A position of the first dopant DP1 and a position of the second dopant DP2 may be adjusted by an acceleration voltage of a dopant during doping. As a doping operation is performed in an upper portion of the semiconductor layer 210, an acceleration voltage injecting the second dopant DP2 into the semiconductor layer 210 may be greater than an acceleration voltage injecting the first dopant DP1. In some embodiments, the acceleration voltage injecting the second dopant DP2 into the semiconductor layer 210 may be about 10 kilo-electronvolts (keV) to about 40 keV, and the acceleration voltage injecting the first dopant DP1 into the semiconductor layer 210 may be about 1 keV to about 5 keV.

FIG. 2A is a graph obtained by measuring concentration distributions of the first dopant DP1 and the second dopant DP2 in a depth direction from an upper surface to a lower surface of the channel area 210c. Here, the first dopant DP1 may be boron (B) and injected from an upper surface of the channel area 210c with an acceleration voltage of 3 keV, and the second dopant DP2 may be phosphorus (P) and injected from the upper surface with an acceleration voltage of 23 keV. In FIGS. 2A and 2B, a unit of measuring ion concentrations of the first dopant DP1 and the second dopant DP2 is ion/cm 3, which is different from a unit ions/cm² of an ion concentration presented in the present disclosure.

Referring to FIG. 2A, it may be seen that the first dopant DP1 is mostly arranged to a depth of 0 angstroms (Å) to 200 Å from the upper surface of channel area 210c, and a maximum value of the concentration of the first dopant DP1 is formed at a depth of about 50 Å to 70 Å. It may be seen that the second dopant DP2 may be arranged at a depth of about 200 Å to 500 Å, which is a boundary area between the semiconductor layer 210 and the buffer layer 111. That is, it may be seen that a maximum value of the concentration of the second dopant DP2 is formed at a depth of about 230 Å to 300 Å. A maximum concentration position of the first dopant DP1 and a maximum concentration position of the second dopant DP2 may be formed separately.

As the second dopant DP2 is doped near the boundary between the semiconductor layer 210 and the buffer layer 111, the second dopant DP2 may also be partially doped in the buffer layer 111 below the semiconductor layer 210. That is, the second dopant DP2 may be at least partially doped in an upper portion of the buffer layer 111.

In the first conductive area 210a and the second conductive area 210b, the first dopant DP1 may be entirely doped in the first conductive area 210a and the second conductive area 210b at a third concentration. In this case, one of the first conductive area 210a and the second conductive area 210b may be a source area, and other one may be a drain area. The third concentration may be greater than the first concentration. For example, the third concentration may be about 100 times to about 1,000 times greater than the first concentration. The third concentration may be about 1E14 ions/cm² to about 1E15 ions/cm² ($1 \times 10^{14}$ to $1 \times 10^{15}$).

As the first dopant DP1 is doped near an upper surface of the channel area 210c, a surface channel through which charges move from an upper surface of the channel area 210c may be formed. As the surface channel is formed, a trap/de-trap phenomenon of carriers is effectively reduced. This means that a driving speed of the thin-film transistor TFT may be increased.

In addition, formation of a buried channel in the channel area 210c may be prevented by doping a lower portion of the channel area 210c with the second dopant DP2 having a different type of charge from the type of the first dopant DP1. If only the first dopant DP1 is doped in the channel area 210c, an undesired buried channel may be formed because the channel area 210c is provided with a low doping concentration. However, in the present disclosure, a phenomenon of the buried channel may be effectively prevented by doping the second dopant DP2 on the lower portion of the channel area 210c.

The gate insulating layer 112 may cover the semiconductor layer 210 and may be on the buffer layer 111. The gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or the like. The gate insulating layer 112 may include a single layer or a multi-layer, each including the above-stated inorganic insulating material.

The gate electrode 230 may be on the gate insulating layer 112. The gate electrode 230 may overlap at least a part of the semiconductor layer 210 in a plan view. The gate electrode 230 may be arranged to overlap the channel area 210c of the semiconductor layer 210 in a plan view. The gate electrode 230 may include a single layer or a multi-layer, each including at least one metal selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In some embodiments, the second inorganic barrier layer 104 of the substrate 100 may be doped with the first dopant DP1. The first dopant DP1 may be doped in the second inorganic barrier layer 104 at a concentration of about 1E11 ions/cm² to about 1E13 ions/cm². The first dopant DP1 may be doped such that a maximum concentration thereof is distributed in the middle of the second inorganic barrier layer 104 in a thickness direction (i.e., depth direction, z direction).

FIG. 2B is a graph obtained by measuring the concentration distribution of the first dopant DP1 in a depth direction from an upper surface to a lower surface of the second inorganic barrier layer 104, according to an embodiment. Here, the first dopant DP1 may be boron (B) and injected with an acceleration voltage of 25 keV.

Referring to FIG. 2B, it may be seen that the first dopant DP1 is distributed at a depth of about 1500 Å to 3500 Å with respect to the upper surface of the second inorganic barrier layer 104. That is, a maximum concentration position of the first dopant DP1 may be formed at a middle area of the second inorganic barrier layer 104 in the depth direction. A concentration of the first dopant DP1 in the second inorganic barrier layer 104 may be about 1E11 ions/cm² to about 1E13 ions/cm².

As the first dopant DP1 is doped in the second inorganic barrier layer 104, a polarization phenomenon is induced in the second inorganic barrier layer 104 by an interaction with the second dopant DP2 at the boundary between the semiconductor layer 210 and the buffer layer 111, and a dielectric constant of the second inorganic barrier layer 104 may be improved. Accordingly, performance of the thin-film transistor TFT may be effectively improved.

That is, as the first dopant DP1 in the second inorganic barrier layer 104, the second dopant DP2 at the boundary between the semiconductor layer 210 and the buffer layer 111, and the first dopant DP1 in the upper portion of the channel area 210c interact, a channel of the channel area 210c may be formed near the upper surface and the lower surface thereof, and an effect of reducing the trap/de-trap phenomenon of carriers may be maximized.

Although FIG. 1A illustrates that the substrate 100 includes the first base layer 101, the first inorganic barrier layer 102, the second base layer 103, and the second inorganic barrier layer 104, which are stacked, and the first dopant DP1 is doped in the second inorganic barrier layer 104, the present disclosure is not limited thereto.

In another embodiment, as shown in FIG. 1B, a separate inorganic barrier layer 105 may be disposed between the substrate 100 and the buffer layer 111, and the first dopant DP1 may also be doped into the inorganic barrier layer 105.

The inorganic barrier layer 105 may include silicon oxide ($SiO_2$), silicon nitride ($SiN_x$), or silicon oxynitride ($SiO_xN_y$). The first dopant DP1 may have a maximum doping concentration in a middle area of the inorganic barrier layer 105, and the concentration of the first dopant DP1 may be about 1E11 ions/$cm^2$ to about 1E13 ions/come.

Figure 3:
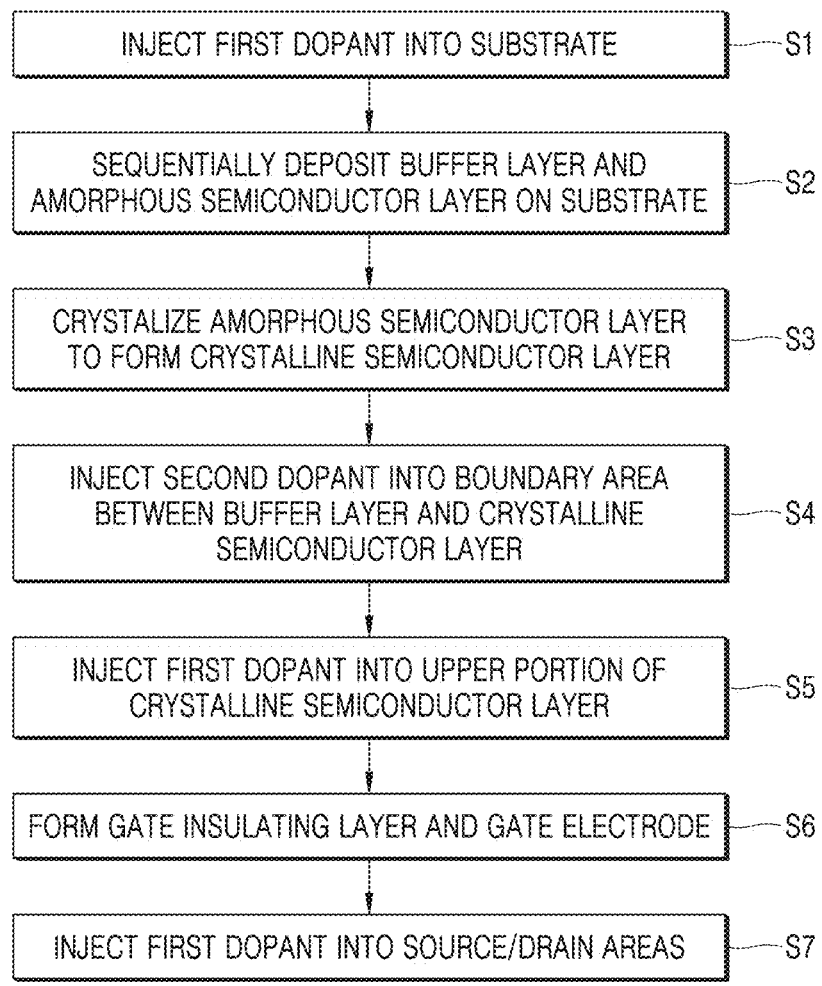
FIG. 3 is a flowchart illustrating a method of manufacturing a thin-film transistor substrate according to an embodiment.

FIG. 3 is a flowchart illustrating a method of manufacturing a thin-film transistor substrate according to an embodiment, and FIGS. 4A to 4E are schematic cross-sectional views sequentially illustrating a method of manufacturing a thin-film transistor substrate according to an embodiment.

Figure 4A:
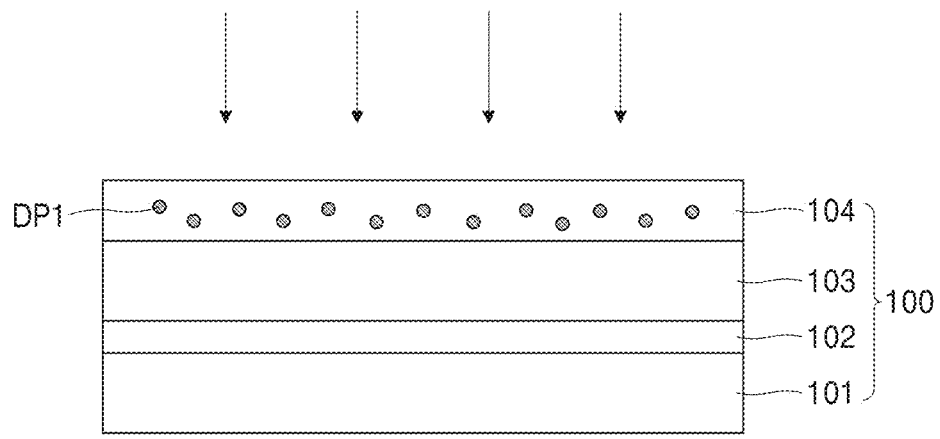
FIGS. 4A to 4E are schematic cross-sectional views sequentially illustrating a method of manufacturing a thin-film transistor substrate according to an embodiment.

First, referring to FIG. 4A, in operation S1, the first dopant DP1 is injected into the substrate 100.

The substrate 100 may be formed by sequentially stacking the first base layer 101, the first inorganic barrier layer 102, the second base layer 103, and the second inorganic barrier layer 104. The second inorganic barrier layer 104 may include an inorganic material such as silicon oxide ($SiO_2$), silicon nitride ($SiN_x$), silicon oxynitride ($SiO_xN_y$), or the like, and may be deposited through chemical vapor deposition ("CVD") or atomic layer deposition ("ALD").

The first dopant DP1 may be injected to have a maximum concentration in the middle area of the second inorganic barrier layer 104 in a thickness direction thereof, where the second inorganic barrier layer 104 may corresponds to an upper portion of the substrate 100. At this time, the first dopant DP1 may be doped with an acceleration voltage of about 10 keV to about 40 keV, and the doping concentration thereof may be about 1E11 ions/$cm^2$ to about 1E13 ions/$cm^2$. In some embodiments, the acceleration voltage of the first dopant DP1 may be about 25 keV, and the concentration thereof may be about 1E12 ions/$cm^2$ ($1 \times 10^{12}$).

Figure 4B:
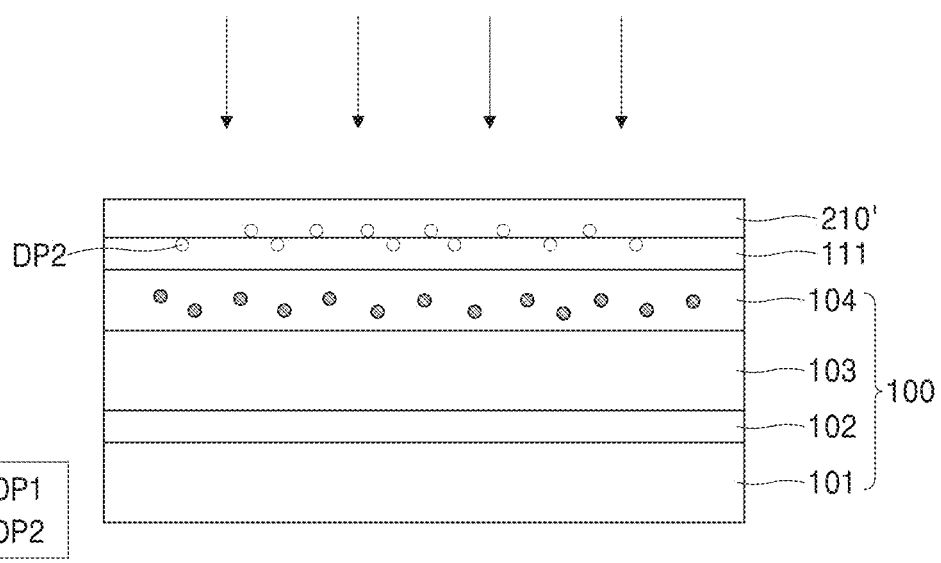

Next, referring to FIG. 4B, in operation S2, the buffer layer 111 and an amorphous semiconductor layer are sequentially deposited on an upper surface of the substrate 100.

The buffer layer 111 may include an inorganic material such as silicon oxide ($SiO_2$), silicon nitride ($SiN_x$), silicon oxynitride ($SiO_xN_y$), or the like, and may be deposited through CVD or ALD. Then, the amorphous semiconductor layer, for example, an amorphous silicon layer, is deposited on the buffer layer 111.

Subsequently, in operation S3, the amorphous semiconductor layer is crystallized to form a crystalline semiconductor layer 210'.

The amorphous silicon layer may be crystallized by various methods, such as a rapid thermal annealing ("RTA") method, a solid phase crystallization ("SPC") method, an excimer laser annealing ("ELA") method, a metal induced crystallization ("MIC") method, a metal induced lateral crystallization ("MILC") method, a sequential lateral solidification ("SLS") method, or the like, to form a polysilicon layer (i.e., crystalline semiconductor layer 210').

Then, in operation S4, the second dopant DP2 is injected into an upper portion of the crystalline semiconductor layer 210'.

The second dopant DP2 may be injected to have a maximum concentration in a boundary area between the buffer layer 111 and the crystalline semiconductor layer 210'. At this time, the second dopant DP2 may be doped with an acceleration voltage of about keV to about 40 keV, and the doping concentration thereof may be about 1E11 ions/$cm^2$ to about 1E13 ions/$cm^2$. In some embodiments, the acceleration voltage of the second dopant DP2 may be about 23 keV, and the concentration thereof may be about ions/$cm^2$.

If the second dopant DP2 is injected before the amorphous semiconductor layer is crystallized and then the amorphous semiconductor layer is crystallized, a position of the semiconductor layer 210 may be shifted, and thus, it is preferable to inject the second dopant DP2 after the amorphous semiconductor layer is crystallized.

Figure 4C:
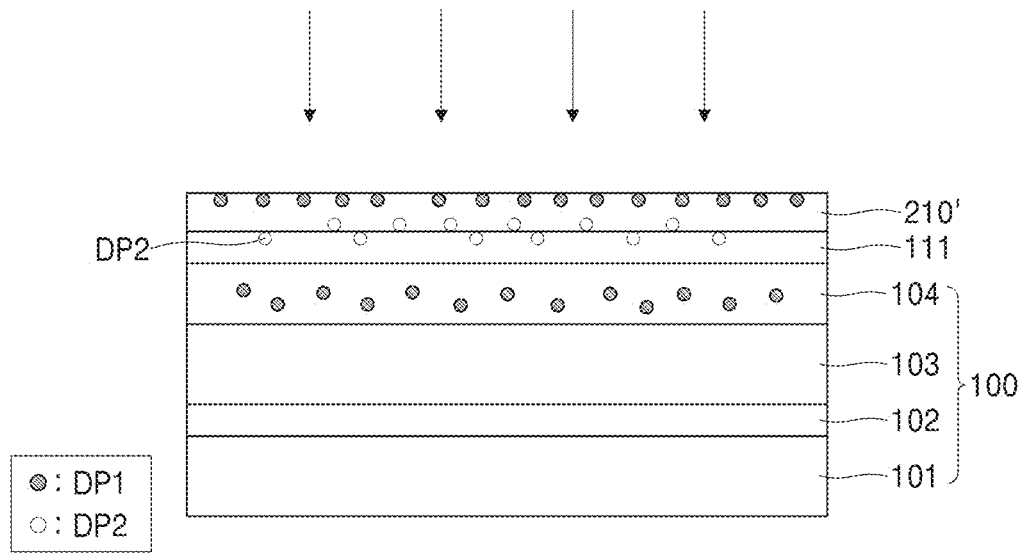

Next, referring to FIG. 4C, in operation S5, the first dopant DP1 may be injected into the upper portion of the crystalline semiconductor layer 210'.

The first dopant DP1 may be injected into the upper portion of the crystalline semiconductor layer 210' to have a maximum concentration. At this time, the first dopant DP1 may be doped with an acceleration voltage of about 1 keV to about 5 keV, and the doping concentration thereof may be about 1E11 ions/$cm^2$ to about 1E13 ions/$cm^2$. In some embodiments, the acceleration voltage of the first dopant DP1 may be about 3 keV, and the concentration thereof may be about 1.5E12 ions/$cm^2$.

Figure 4D:
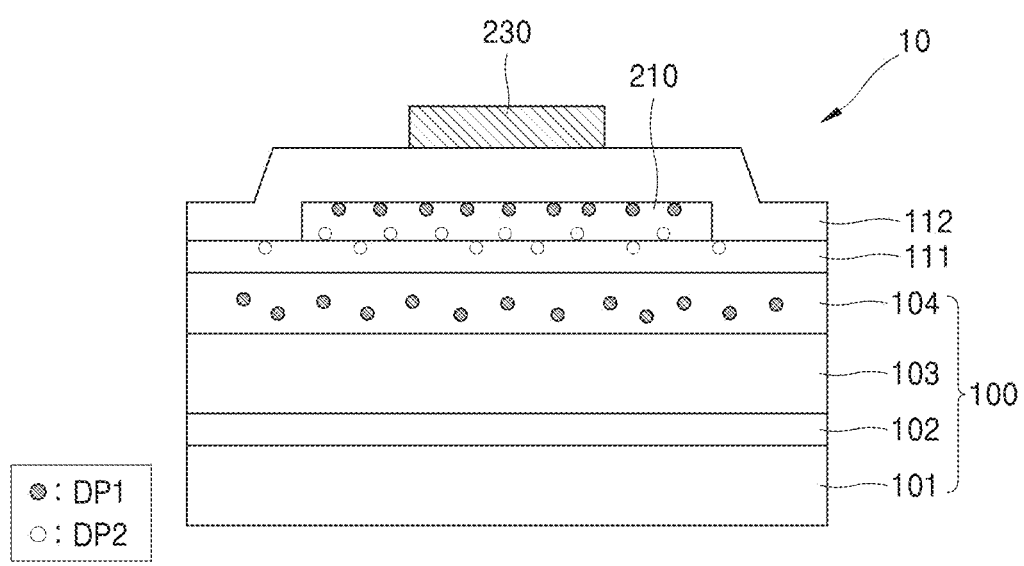

Then, referring to FIG. 4D, the semiconductor layer 210 is formed by patterning the crystalline semiconductor layer 210'. The crystalline semiconductor layer 210' may be patterned as the semiconductor layer 210 by a photolithography operation using a mask (not shown).

Subsequently, in operation S6, the gate insulating layer 112 covering the semiconductor layer 210, and the gate electrode 230 are formed on the substrate 100, especially on the gate insulating layer 112.

The gate insulating layer 112 may include an inorganic material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or the like, and may be formed through CVD or ALD.

The gate electrode 230 may be formed by forming a metal layer such as Mo and Ti by a deposition method, such as CVD, plasma enhanced CVD ("PECVD"), low pressure CVD ("LPCVD"), physical vapor deposition ("PVD"), sputtering, ALD, or the like, and then patterning the metal layer.

Figure 4E:
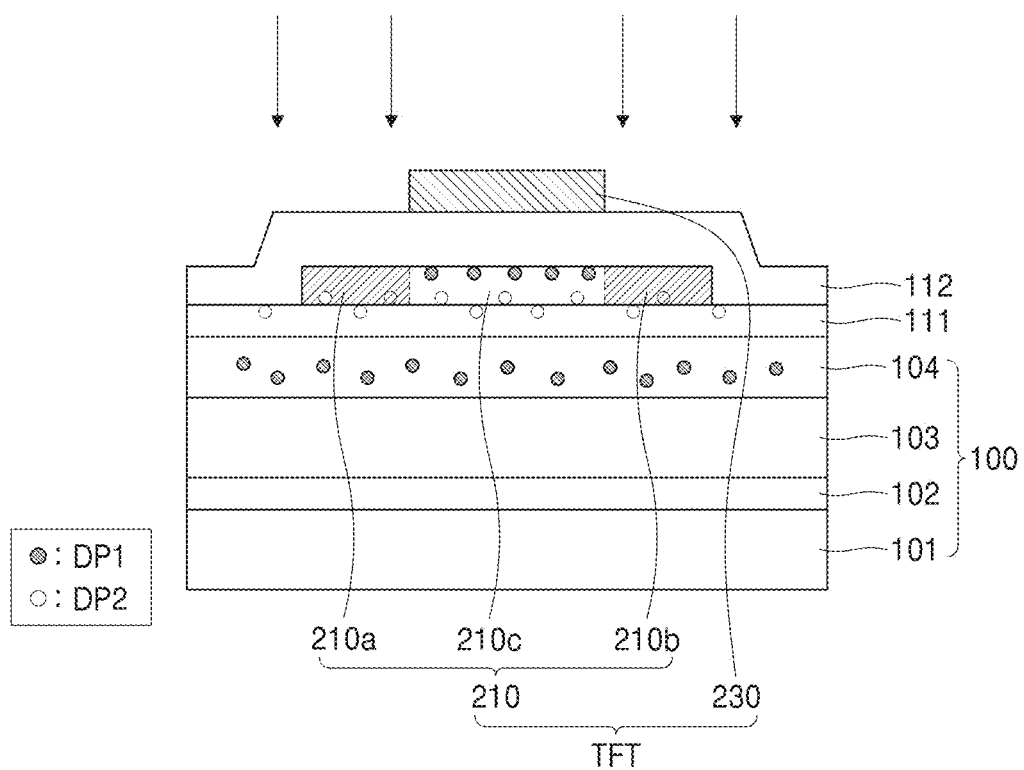

Then, referring to FIG. 4E, in operation S7, the first dopant DP1 is injected in to the semiconductor layer 210 by using the gate electrode 230 as a mask.

At this time, the first dopant DP1 may be doped with an acceleration voltage of about 10 keV to about 40 keV, and the doping concentration thereof may be about 1E14 ions/$cm^2$ to about 1E15 ions/$cm^2$. Accordingly, the channel area 210c, the first conductive area 210a, and the second conductive area 210b may be formed in the semiconductor layer 210, where the first conductive area 210a and the second conductive area 210b are disposed on opposite sides of the channel area 210c, respectively. The first conductive area 210a and the second conductive area 210b may serve as source/drain areas, respectively.

Figure 5:
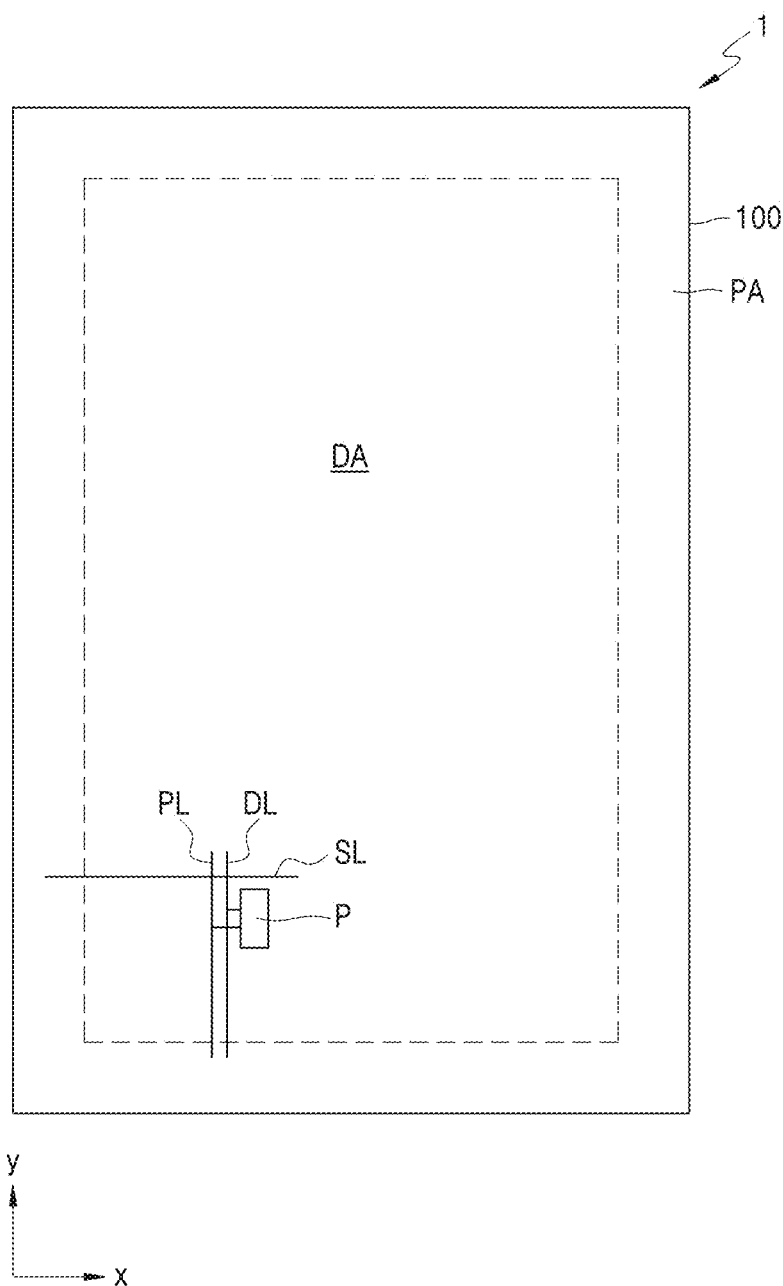
FIG. 5 is a plan view schematically illustrating a display apparatus according to various embodiments.

FIG. 5 is a plan view schematically illustrating a display apparatus 1 according to various embodiments.

Referring to FIG. 5, the substrate 100 of the display apparatus 1 may be divided into a display area DA and a peripheral area PA around the display area DA. The display apparatus 1 may provide an image by using light emitted from a plurality of pixels P in the display area DA.

Each of the plurality of pixels P includes a display element such as an organic light-emitting diode or an inorganic light-emitting diode, and may emit, for example, red, green, blue, or white light. That is, each pixel P may be connected to a pixel circuit including a thin-film transistor ("TFT"), a storage capacitor, or the like. The pixel circuit may be connected to a scan line SL, a data line DL crossing the scan line SL, and a driving voltage line PL. The scan line SL may extend in an x direction, and the data line DL and the driving voltage line PL may extend in a y direction.

Each pixel P may emit light by driving the pixel circuit, and the display area DA may provide an image through light emitted from the plurality of pixels P. As described above, the pixel P in the present disclosure may be defined as an emission area emitting any one color of red, green, blue, or white light.

The peripheral area PA is an area in which the plurality of pixels P are not arranged, and does not provide an image. A built-in driving circuit unit, a power supply line, a terminal unit to which a printed circuit board or a driver integrated circuit ("IC") including a driving circuit unit is connected, or the like, may be arranged in the peripheral area PA.

The display apparatus 1 according to an embodiment of the present disclosure may include an organic light-emitting display apparatus, an inorganic electroluminescence ("EL") display apparatus, a quantum dot display apparatus, or the like. Hereinafter, although an organic light-emitting display apparatus is described as an example of a display apparatus according to an embodiment of the present disclosure, the display apparatus is not limited thereto, and characteristics to be described below may be applied to display apparatuses of various types as described above.

Figure 6:
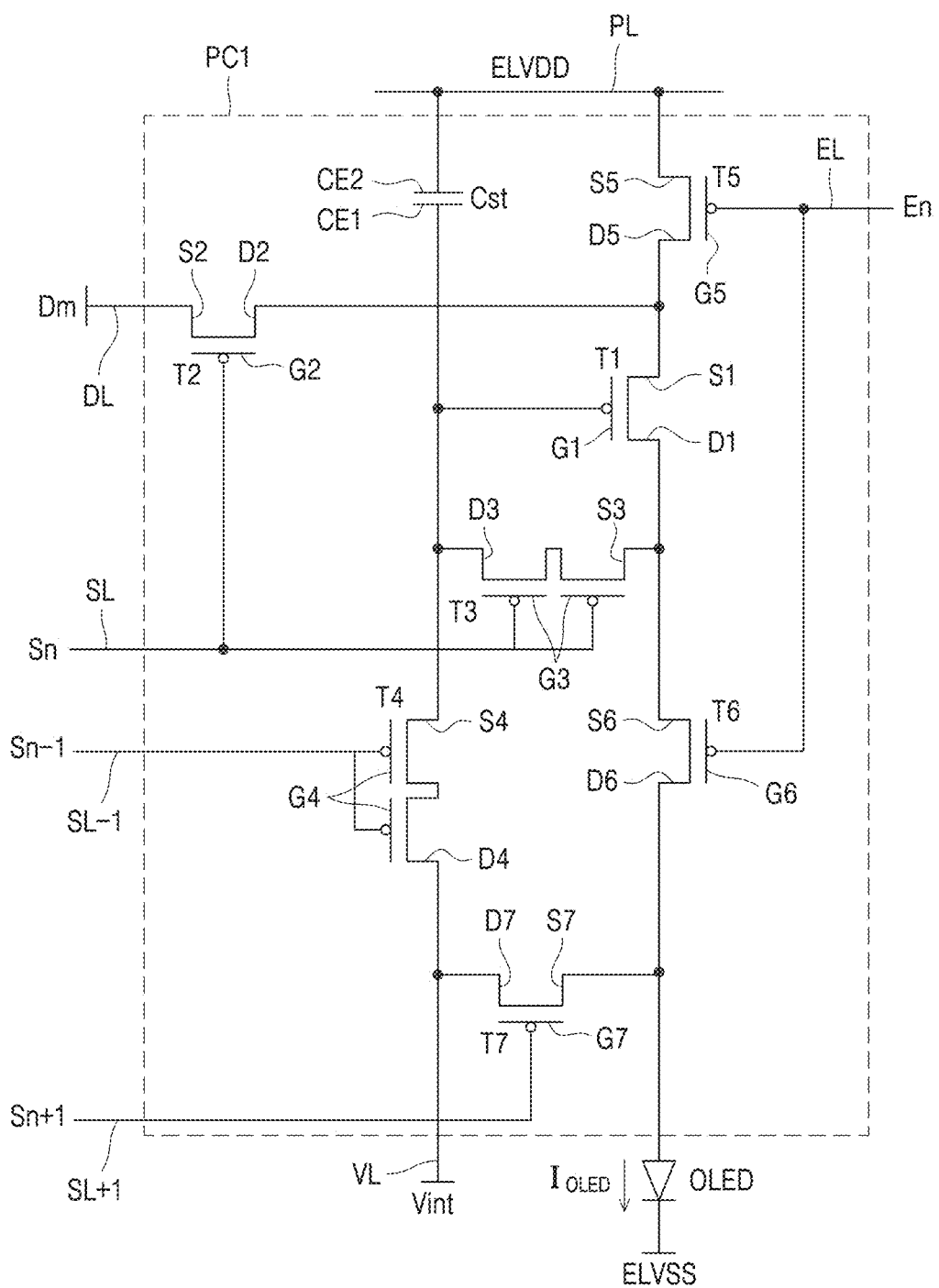
FIG. 6 is an equivalent circuit diagram illustrating a pixel circuit driving a pixel and a display element connected to the pixel circuit, according to an embodiment.

FIG. 6 is an equivalent circuit diagram illustrating a pixel circuit PC1 driving a pixel and a display element connected to the pixel circuit PC1, according to an embodiment.

Referring to FIG. 6, the pixel circuit PC1 according to an embodiment may include first to seventh thin-film transistors T1 to T7, and a capacitor Cst. The first to seventh thin-film transistors T1 to T7 and the capacitor Cst may be connected to first to third scan lines SL, SL−1, and SL+1 configured to transfer first to third scan signals Sn, Sn−1, and Sn+1, respectively, the data line DL configured to transfer a data voltage Dm, an emission control line EL configured to transfer an emission control signal En, the driving voltage line PL configured to transfer a driving voltage ELVDD, an initialization voltage line VL configured to transfer an initialization voltage Vint, and an opposite electrode to which a common voltage ELVSS is applied.

The first thin-film transistor T1 may be a driving transistor in which a magnitude of a drain current thereof is determined according to a gate-source voltage, and the second to seventh thin-film transistor T2 to T7 may each be a switching transistor which is turned on/off according to a gate-source voltage and substantially a gate voltage.

The first thin-film transistor T1 may be referred to as a driving thin-film transistor, the second thin-film transistor T2 may be referred to as a scan thin-film transistor, the third thin-film transistor T3 may be referred to as a compensation thin-film transistor, a fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

The capacitor Cst is connected between the driving voltage line PL and a driving gate G1 of the driving thin-film transistor T1. The capacitor Cst may have an upper electrode CE2 connected to the driving voltage line PL, and a lower electrode CE1 connected to the driving gate G1 of the driving thin-film transistor T1.

The driving thin-film transistor T1 may control a magnitude of a driving current $I_{OLED}$ flowing from the driving voltage line PL to an organic light-emitting diode OLED in accordance with a gate-source voltage. The driving thin-film transistor T1 may have the driving gate G1 connected to the lower electrode CE1 of the capacitor Cst, a driving source S1 connected to the driving voltage line PL via the first emission control thin-film transistor T5, and a driving drain D1 connected to the organic light-emitting diode OLED via the second emission control thin-film transistor T6.

The driving thin-film transistor T1 may output the driving current $I_{OLED}$ to the organic light-emitting diode OLED in accordance with the gate-source voltage thereof. The magnitude of the driving current $I_{OLED}$ is determined based on a difference between the gate-source voltage and a threshold voltage of the driving thin-film transistor T1. The organic light-emitting diode OLED may receive the driving current $I_{OLED}$ from the driving thin-film transistor T1 and emit light with a brightness according to the magnitude of the driving current $I_{OLED}$.

The scan thin-film transistor T2 is configured to deliver the data voltage Dm to the driving source S1 of the driving thin-film transistor T1 in response to the first scan signal Sn. The scan thin-film transistor T2 may have a scan gate G2 connected to the first scan line SL, a scan source S2 connected to the data line DL, and a scan drain D2 connected to the driving source S1 of the driving thin-film transistor T1.

The compensation thin-film transistors T3 are connected in series between the driving drain D1 and the driving gate G1 of the driving thin-film transistor T1 and connect the driving drain D1 and the driving gate G1 to each other of the driving thin-film transistor T1 in response to the first scan signal Sn. The compensation thin-film transistors T3 may have a compensation gate G3 connected to the first scan line SL, a compensation source S3 connected to the driving drain D1 of the driving thin-film transistor T1, and a compensation drain D3 connected to the driving gate G1 of the driving thin-film transistor T1. Although FIG. 6 illustrates that the compensation thin-film transistors T3 include two thin-film transistors connected to each other in series, the compensation thin-film transistor T3 may include one thin-film transistor.

The gate initialization thin-film transistor T4 applies the initialization voltage Vint to the driving gate G1 of the driving thin-film transistor T1 in response to the second scan signal Sn−1. The gate initialization thin-film transistor T4 may have a first initialization gate G4 connected to the second scan line SL−1, a first initialization source S4 connected to the driving gate G1 of the driving thin-film transistor T1, and a first initialization drain D4 connected to the initialization voltage line VL. Although FIG. 6 illustrates that the gate initialization thin-film transistor T4 includes two thin-film transistors connected to each other in series, the gate initialization thin-film transistor T4 may include one thin-film transistor.

The anode initialization thin-film transistor T7 applies the initialization voltage Vint to an anode of the organic light-emitting diode OLED in response to the third scan signal Sn+1. The anode initialization thin-film transistor T7 may have a second initialization gate G7 connected to the third scan line SL+1, a second initialization source S7 connected to the anode of the organic light-emitting diode OLED, and a second initialization drain D7 connected to the initialization voltage line VL.

The first emission control thin-film transistor T5 may connect the driving voltage line PL and the driving source S1 of the driving thin-film transistor T1 to each other in response to the emission control signal En. The first emission control thin-film transistor T5 may have a first emission control gate G5 connected to the emission control line EL, a first emission control source S5 connected to the driving voltage line PL, and a first emission control drain D5 connected to the driving source S1 of the driving thin-film transistor T1.

The second emission control thin-film transistor T6 may connect the driving drain D1 of the driving thin-film transistor T1 and the anode of the organic light-emitting diode OLED to each other in response to the emission control signal En. The second emission control thin-film transistor T6 may have a second emission control gate G6 connected to the emission control line EL, a second emission control source S6 connected to the driving drain D1 of the driving thin-film transistor T1, and the second emission control drain D6 connected to the organic light-emitting diode OLED.

The second scan signal Sn−1 may be substantially synchronized with the first scan signal Sn of a previous row. The third scan signal Sn+1 may be substantially synchronized with the first scan signal Sn. According to another embodiment, the third scan signal Sn+1 may substantially synchronized with the first scan signal Sn of the next row.

In an embodiment, the first to seventh thin-film transistors T1 to T7 may each include a semiconductor layer including silicon. For example, the first to seventh thin-film transistors T1 to T7 may each include a semiconductor layer including low temperature poly-silicon ("LTPS").

As another embodiment, some semiconductor layers of the first to seventh thin-film transistors T1 to T7 may include LTPS, and other semiconductor layers may also include an oxide semiconductor. The oxide semiconductor may include an oxide of at least one or more materials selected from a group including indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the oxide semiconductor may be an InSnZnO ("ITZO") semiconductor, an InGaZnO ("IGZO") semiconductor, or the like.

Hereinafter, a detailed operation of one pixel of the display apparatus 1 according to an embodiment is described in detail. As shown in FIG. 6, it is assumed that the first to seventh thin-film transistors T1 to T7 are P-type metal-oxide-semiconductor field-effect transistors ("MOSFET").

First, when the emission control signal En having a high level is received, the first emission control thin-film transistor T5 and the second emission control thin-film transistor T6 are turned off, the driving thin-film transistor T1 stops an output of the driving current $I_{OLED}$, and the organic light-emitting diode OLED stops emitting light.

Thereafter, during a gate initialization period in which the second scan signal Sn−1 having a low level is received, the gate initialization thin-film transistor T4 is turned on, and the initialization voltage Vint is applied to the driving gate G1 of the driving thin-film transistor T1, that is, the lower electrode CE1 of the capacitor Cst. A difference ELVDD−Vint between the driving voltage ELVDD and the initialization voltage Vint is stored in the capacitor Cst.

Then, during a data writing period in which the first scan signal Sn having a low level is received, the scan thin-film transistor T2 and the compensation thin-film transistor T3 are turned on, and the data voltage Dm is received by the driving source S1 of the driving thin-film transistor T1. The driving thin-film transistor T1 is diode-connected by the compensation thin-film transistor T3, and is biased in a forward direction. A gate voltage of the driving thin-film transistor T1 increases from the initialization voltage Vint.

When the gate voltage of the driving thin-film transistor T1 becomes equal to a data compensation voltage Dm−|Vth| obtained by reducing an absolute value |Vth| of a threshold voltage of the driving thin-film transistor T1 from the data voltage Dm, an increase of the gate voltage of the driving thin-film transistor T1 is stopped while the driving thin-film transistor T1 is turned off. Accordingly, a difference ELVDD−Dm+|Vth| between the driving voltage ELVDD and the data compensation voltage Dm−|Vth| is stored in the capacitor Cst.

In addition, during an anode initialization period in which the third scan signal Sn+1 having a low level is received, the anode initialization thin-film transistor T7 is turned on, and the initialization voltage Vint is applied to the anode of the organic light-emitting diode OLED. By applying the initialization voltage Vint to the anode of the organic light-emitting diode OLED to completely non-emit the organic light-emitting diode OLED, a pixel receives the data voltage Dm corresponding to a black grayscale in a next frame, but a phenomenon in which the organic light-emitting diode OLED emits fine light may be eliminated.

The first scan signal Sn and the third scan signal Sn+1 may be substantially synchronized, and in this case, the data writing period and the anode initialization period may be the same period.

Subsequently, when the emission control signal En having a low level is received, the first emission control thin-film transistor T5 and the second emission control thin-film transistor T6 may be turned on, the driving thin-film transistor T1 may output the driving current $I_{OLED}$ corresponding to a voltage ELVDD−Dm obtained by subtracting an absolute value of the threshold voltage |Vth| of the driving thin-film transistor T1 from a voltage stored in the capacitor Cst, that is, a source-gate voltage ELVDD−Dm+|Vth| of the driving thin-film transistor T1, and the organic light-emitting diode OLED may emit light with a brightness corresponding to the magnitude of the driving current $I_{OLED}$.

Figure 7:
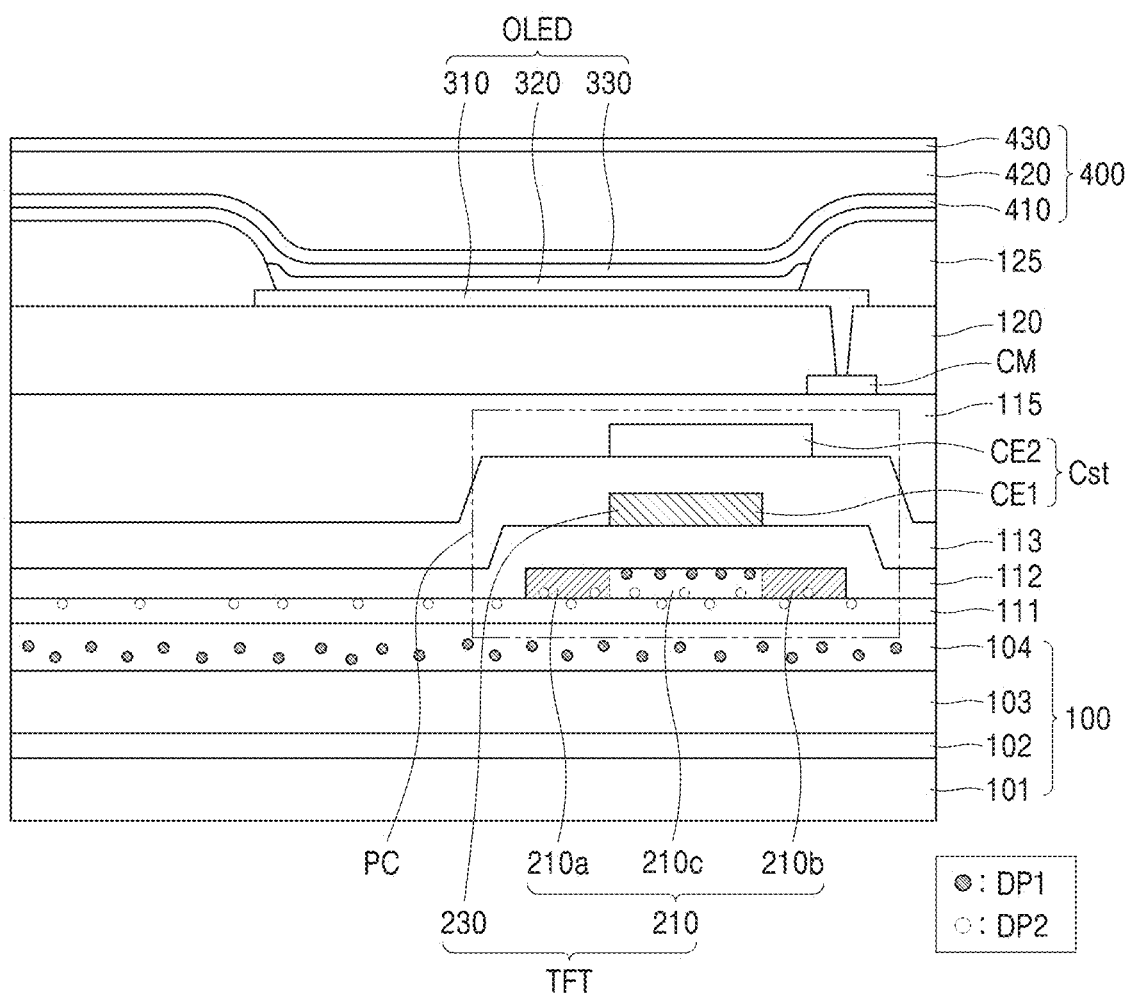
FIG. 7 is a cross-sectional view schematically illustrating a display apparatus according to an embodiment.

FIG. 7 is a cross-sectional view schematically illustrating a display apparatus according to an embodiment. In FIG. 7, the same reference numerals as those in FIG. 1A refer to the same members, and redundant descriptions thereof are omitted.

Referring to FIG. 7, the display apparatus includes the substrate 100, a pixel circuit PC on the substrate 100, and the organic light-emitting diode OLED electrically connected to the pixel circuit PC. The pixel circuit PC may include the thin-film transistor TFT and the capacitor Cst.

The thin-film transistor TFT may be the thin-film transistor TFT already described with reference to FIG. 1A, and may be a driving thin-film transistor. The first dopant DP1 and the second dopant DP2, which are different types from each other, may be included in the semiconductor layer 210 of the thin-film transistor TFT.

The first dopant DP1 may be arranged in the upper portion of the channel area 210c of the semiconductor layer 210, and the second dopant DP2 may be arranged in the lower portion of the channel area 210c of the semiconductor layer 210. In the first conductive area 210a and the second conductive area 210b of the semiconductor layer 210, the first dopant DP1 may be doped at a concentration greater than that of the first dopant DP1 doped in the channel area 210c. The concentration of the first dopant DP1 doped in the channel area 210c may be about 1E11 ions/cm² to about 1E13 ions/cm². The concentration of the first dopant DP1 doped in the first conductive area 210a and the second conductive area 210b may be about 1E14 ions/cm² to about 1E15 ions/cm². The concentration of the second dopant DP2 doped in the channel area 210c may be about 1E11 ions/cm$^2$ to about 1E13 ions/cm$^2$. In some embodiments, the first dopant DP1 may be boron (B), and the second dopant DP2 may be phosphorus (P).

As the second dopant DP2 is doped at the boundary between the semiconductor layer 210 and the buffer layer 111, the second dopant DP2 may also be arranged in an upper portion of the buffer layer 111. The first dopant DP1 may be doped in the second inorganic barrier layer 104 of the substrate 100. The concentration of the first dopant DP1 doped in the second inorganic barrier layer 104 may be about 1E11 ions/cm$^2$ to about 1E13 ions/cm$^2$.

An insulating layer 113 may be on the gate electrode 230 of the thin-film transistor TFT. The insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), or the like. The insulating layer 113 may include a single layer or a multi-layer, each including the above-stated inorganic insulating material.

The capacitor Cst may be formed above the gate electrode 230 of the thin-film transistor TFT by overlapping the gate electrode 230 in a plan view. The capacitor Cst includes the lower electrode CE1 and the upper electrode CE2. The insulating layer 113 may be disposed between the lower electrode CE1 and the upper electrode CE2. In this case, the gate electrode 230 may function not only as a gate electrode of the thin-film transistor TFT, but also as the lower electrode CE1 of the capacitor Cst. That is, the gate electrode 230 and the lower electrode CE1 may be integrally formed. The upper electrode CE2 may be arranged on the insulating layer 113 to at least partially overlap the lower electrode CE1 in a plan view.

Each of the lower electrode CE1 and the upper electrode CE2 may include a single layer or a multi-layer, each including at least one metal selected from Al, Pt, Pd, Ag, Mg, Au, Ni, Nd, Ir, Cr, Li, Ca, Mo, Ti, W, and Cu.

An interlayer insulating layer 115 covers the upper electrode CE2. A conductive layer CM may be on the interlayer insulating layer 115. The conductive layer CM may be a connection electrode electrically connects one electrode of a plurality of transistors of the pixel circuit PC to a pixel electrode 310.

An organic insulating layer 120 may cover the conductive layer CM and be on the interlayer insulating layer 115. The organic insulating layer 120 may include a single layer or a multi-layer.

The organic insulating layer 120 may include photosensitive polyimide, polyimide, polystyrene ("PS"), polycarbonate, benzocyclobutene (BCB), hexamethyldisiloxane ("HMDSO"), a general commercial polymer such as polymethylmethacrylate ("PMMA") or PS, a polymer derivative having a phenol group, an acrylic polymer, an imide polymer, an aryl ether polymer, an amide polymer, a fluorine polymer, a p-xylene polymer, a vinyl alcohol polymer, or the like.

Alternatively, the organic insulating layer 120 may include a siloxane-based organic material. The siloxane-based organic material may include HMDSO, octamethyltrisiloxane, decamethyltetrasiloxane, dodecamethylpentasiloxane, and polydimethylsiloxane. The organic insulating layer 120 may serve as a protective film covering the plurality of transistors of the pixel circuit PC.

The organic light-emitting diode OLED including the pixel electrode 310, an opposite electrode 330, and an intermediate layer 320 arranged therebetween and including an emission layer may be on the organic insulating layer 120.

The pixel electrode 310 may be electrically connected to the conductive layer CM through a contact hole defined in the organic insulating layer 120, and may be electrically connected to the plurality of thin-film transistors included in the pixel circuit PC through the conductive layer CM. The pixel electrode 310 may be directly connected to the first thin-film transistor T1, or may be indirectly connected to the first thin-film transistor T1 via another thin-film transistor (not shown) having a function of controlling emission.

The pixel electrode 310 may include a conductive oxide material such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). The pixel electrode 310 may include a reflective film including Ag, Mg, Al, or a compound thereof. For example, the pixel electrode 310 may have a structure including films including ITO, IZO, ZnO, or $In_2O_3$ above/below the above-stated reflective film. In this case, the pixel electrode 310 may have a stacked structure of ITO/Ag/ITO.

A pixel defining film 125 may be on the organic insulating layer 120. The pixel defining film 125 covers an edge of the pixel electrode 310 and defines a pixel by having an opening through which a central portion of the pixel electrode 310 is exposed. In addition, the pixel defining film 125 prevents an arc or the like from being generated at the edge of the pixel electrode 310 by increasing a distance between the edge of the pixel electrode 310 and the opposite electrode 330 on the pixel electrode 310. The pixel defining film 125 may be formed of an organic insulating material such as polyimide, polyamide, an acrylic resin, BCB, HMDSO, a phenol resin, or the like, in a spin coating method or the like.

The intermediate layer 320 of the organic light-emitting diode OLED may include a low-molecular-weight material or a polymer material, and may emit red, green, blue, or white light. When the intermediate layer 320 includes a low-molecular-weight material, the intermediate layer 320 may have a structure in which a hole injection layer ("HIL"), a hole transport layer ("HTL"), an emission layer ("EML"), an electron transport layer ("ETL"), an electron injection layer ("EIL"), or the like are stacked in a single or complex structure, and may include various organic materials including copper phthalocyanine (CuPc), N,N'-Di(naphthalene-1-yl)-N,N'-diphenyl-benzidine ("NPB"), tris-8-hydroxyquinoline aluminum ($Alq_3$), or the like. The layers may be formed by a method of vacuum deposition.

When the intermediate layer 320 includes a polymer material, the intermediate layer 320 may have a structure including the HTL and the EML. The HTL may include poly(3,4-ethylenedioxythiophene) ("PEDOT"), and the EML may include a polymer material such as poly(p-phenylene vinylene) ("PPV"), polyfluorene, or the like. The intermediate layer 320 may be formed by a screen printing method, an inkjet printing method, a laser induced thermal imaging ("LITI") method, or the like.

The intermediate layer 320 is not limited thereto and may have various structures. In addition, the intermediate layer 320 may include an integral layer over a plurality of pixel electrodes 310, or may include a layer patterned to correspond to each of the plurality of pixel electrodes 310.

The opposite electrode 330 may be on the intermediate layer 320. The opposite electrode 330 may include a conductive material having a low work function. For example, the opposite electrode 330 may include a (semi) transparent layer including Ag, Mg, Al, Pt, Li, Ca, alloys thereof, or the like. Alternatively, the opposite electrode 330 may further include a layer such as ITO, IZO, ZnO, or $In_2O_3$ above the (semi) transparent layer including the above-stated material. The opposite electrode 330 may be integrally formed over a plurality of organic light-emitting diodes OLED to correspond to the plurality of pixel electrodes 310.

A thin-film encapsulation layer 400 may be on the organic light-emitting diode OLED. Because the organic light-emitting diode OLED may be easily damaged by external moisture or oxygen, the organic light-emitting diode OLED may be protected by being covered by the thin-film encapsulation layer 400. The thin-film encapsulation layer 400 may cover a display area and extend to the outside of the display area. The thin-film encapsulation layer 400 includes at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330, and may include silicon oxide ($SiO_2$), silicon nitride ($SiN_x$), silicon oxynitride (SiON), or the like. Although not illustrated in FIG. 7, other layers such as a capping layer may also be between the first inorganic encapsulation layer 410 and the opposite electrode 330 when needed. Because the first inorganic encapsulation layer 410 is formed along an underlying structure, an upper surface of the first inorganic encapsulation layer 410 may not be flat. The organic encapsulation layer 420 may cover the first inorganic encapsulation layer 410, and unlike the first inorganic encapsulation layer 410, an upper surface of the organic encapsulation layer 420 may be formed substantially flat. In detail, the organic encapsulation layer 420 may have a substantially flat upper surface in a portion thereof corresponding to the display area. The organic encapsulation layer 420 may include one or more materials selected from a group including polyethylene terephthalate, polyethylene naphthalate, polycarbonate, polyimide, polyethylene sulfonate, polyoxymethylene, polyarylate, and HMDSO. The second inorganic encapsulation layer 430 may cover the organic encapsulation layer 420, and may include silicon oxide ($SiO_2$), silicon nitride ($SiN_x$), silicon oxynitride (SiON), or the like.

According to the above-stated multi-layered structure of the thin-film encapsulation layer 400, even when cracks occur in the thin-film encapsulation layer 400, the thin-film encapsulation layer 400 may prevent the cracks from connecting between the first inorganic encapsulation layer 410 and the organic encapsulation layer 420 or between the organic encapsulation layer 420 and the second inorganic encapsulation layer 430. Accordingly, the formation of a path, through which external moisture or oxygen, or the like penetrates into the organic light-emitting diode OLED, may be prevented or minimized.

As described above, a thin-film transistor included in a thin-film transistor substrate and a display apparatus according to an embodiment of the present disclosure includes a first dopant and a second dopant, which are different types from each other, in a channel area, thereby minimizing a trap/de-trap phenomenon of carriers. Accordingly, an instantaneous afterimage phenomenon may be improved in a display apparatus employing the same.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thin-film transistor substrate comprising:
a substrate;
a buffer layer on the substrate;
a semiconductor layer arranged on a top surface of the buffer layer and comprising a first conductive area, a second conductive area, and a channel area between the first conductive area and the second conductive area;
a first dopant doped in an upper portion of the channel area at a first concentration;
a second dopant doped in a lower portion of the channel area at a second concentration and being of a different type from a type of the first dopant;
a gate insulating layer covering the semiconductor layer;
a gate electrode overlapping the channel area in a plan view and disposed on the gate insulating layer; and
a barrier layer disposed under a bottom surface of the buffer layer,
wherein the first dopant is doped in the barrier layer.

2. The thin-film transistor substrate of claim 1, wherein the first dopant is doped in the first conductive area and the second conductive area at a third concentration, and the third concentration is greater than the first concentration.

3. The thin-film transistor substrate of claim 2, wherein the third concentration is about 100 to about 1,000 times greater than the first concentration.

4. The thin-film transistor substrate of claim 1, wherein the second dopant is at least partially doped in an upper portion of the buffer layer.

5. The thin-film transistor substrate of claim 1, wherein each of the first concentration of the first dopant and the second concentration of the second dopant in the channel area, is in a range from about $1 \times 10^{11}$ ions/cm$^2$ to about $1 \times 10^{13}$ ions/cm$^2$.

6. The thin-film transistor substrate of claim 1, wherein the substrate comprises a first base layer, a first inorganic barrier layer, a second base layer, and a second inorganic barrier layer, which are sequentially stacked, and
the first dopant is doped in the second inorganic barrier layer.

7. The thin-film transistor substrate of claim 6, wherein a concentration of the first dopant doped in the second inorganic barrier layer is in a range from about $1 \times 10^{11}$ ions/cm$^2$ to about $1 \times 10^{13}$ ions/cm$^2$.

8. The thin-film transistor substrate of claim 1, wherein the first dopant is boron (B), and the second dopant is phosphorus (P).

9. The thin-film transistor substrate of claim 1, wherein a maximum concentration position of the first dopant in the channel area is at a depth of about 50 angstroms (Å) to about 70 Å from the upper surface of the channel area, and a maximum concentration position of the second dopant in the channel area is at a depth of about 200 Å to about 300 Å from the upper surface of the channel area.

10. A display apparatus comprising:
a substrate;
a buffer layer on the substrate;
a barrier layer disposed under a bottom surface of the buffer layer;
a pixel circuit arranged on a top surface of the buffer layer and comprising a thin-film transistor; and a display element electrically connected to the pixel circuit, wherein the thin-film transistor comprises:

a semiconductor layer comprising a first conductive area, a second conductive area, and a channel area between the first conductive area and the second conductive area;

a first dopant doped in an upper portion of the channel area at a first concentration;

a second dopant doped in a lower portion of the channel area at a second concentration and being of a different type from a type of the first dopant; and a gate electrode overlapping the channel area in a plan view, wherein the first dopant is doped in the barrier layer.

11. The display apparatus of claim 10, wherein the first dopant is doped in the first conductive area and the second conductive area at a third concentration, and the third concentration is greater than the first concentration.

12. The display apparatus of claim 10, wherein the second dopant is at least partially doped in an upper portion of the buffer layer.

13. The display apparatus of claim 10, wherein the substrate comprises a first base layer, a first inorganic barrier layer, a second base layer, and a second inorganic barrier layer, which are sequentially stacked, and the first dopant is doped in the second inorganic barrier layer.

14. The display apparatus of claim 10, further comprising:

a barrier layer between the substrate and the buffer layer, wherein the first dopant is doped in the barrier layer.

15. The display apparatus of claim 10, wherein the pixel circuit further comprises a capacitor overlapping the thin-film transistor in the plan view.

16. The display apparatus of claim 15, wherein the capacitor comprises a lower electrode and an upper electrode, and the lower electrode is integrally provided with the gate electrode.

17. The display apparatus of claim 10, wherein the display element comprises an organic light-emitting diode comprising a pixel electrode, an intermediate layer, and an opposite electrode.

18. The display apparatus of claim 16, further comprising:

a thin-film encapsulation layer covering the display element, wherein the thin-film encapsulation layer comprises a first inorganic encapsulation layer, an organic encapsulation layer, and a second inorganic encapsulation layer.

* * * * *